United States Patent [19]
Ernst

[11] 3,968,424
[45] July 6, 1976

[54] FOURIER TRANSFORM NMR SPECTROSCOPY EMPLOYING A PHASE MODULATED RF CARRIER

[75] Inventor: Richard R. Ernst, Winterthur, Switzerland

[73] Assignee: Varian Associates, Palo Alto, Calif.

[22] Filed: Aug. 1, 1974

[21] Appl. No.: 494,017

[52] U.S. Cl. .............................. 324/.5 AC; 324/.5 A
[51] Int. Cl.² .......................................... G01R 33/08
[58] Field of Search ....................... 324/.5 A, .5 AC

[56] References Cited
UNITED STATES PATENTS
3,824,452  7/1974  Freeman .......................... 324/.5 AC

*Primary Examiner*—R. V. Rolinec
*Assistant Examiner*—Michael J. Tokar
*Attorney, Agent, or Firm*—Stanley Z. Cole; Gerald M. Fisher; John M. Morrissey

[57] ABSTRACT

A nuclear magnetic resonance Fourier transform spectrometer includes a pulse modulated rf transmitter for delivering a train of radio frequency pulses having a pulse width pulse repetition rate to generate Fourier side bands to cover the spectral lines of the sample to be analyzed for exciting resonance of different resonance lines, if any, within the sample. Resonance of the sample is scanned in between successive transmitted pulses to obtain a multiplicity of successive time displaced components which are sampled and stored in a multiplicity of memory channels of a computer for time averaging thereof. The time averaged signal components are periodically read out and Fourier transformed to obtain a time averaged spectrum of the sample under analysis. Anomalous phase and intensity effects in the detected spectral lines are avoided by periodically shifting the phase of the pulse modulated carrier signal from one phase to another of at least three different relative phases in accordance with a predetermined sequence.

16 Claims, 5 Drawing Figures

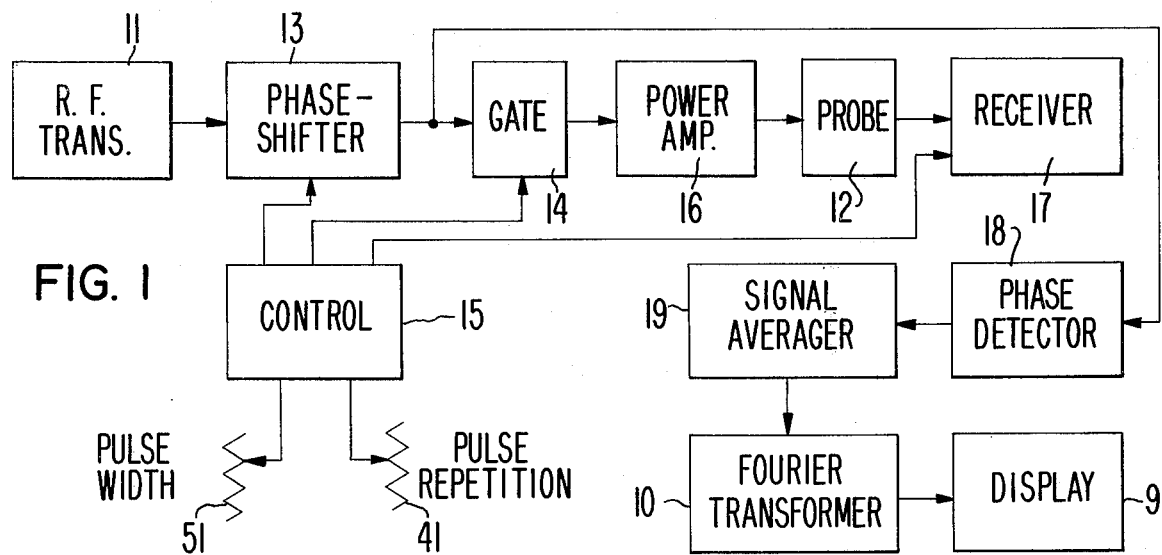
FIG. 1
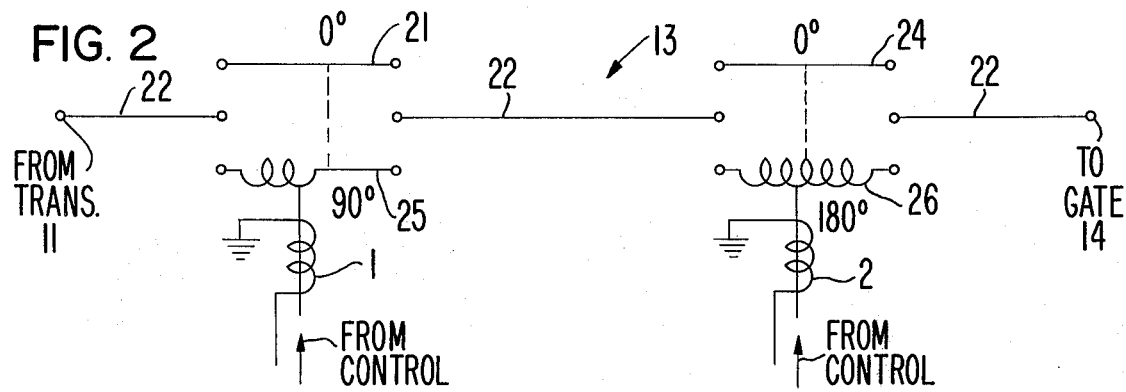
FIG. 2
FIG. 3
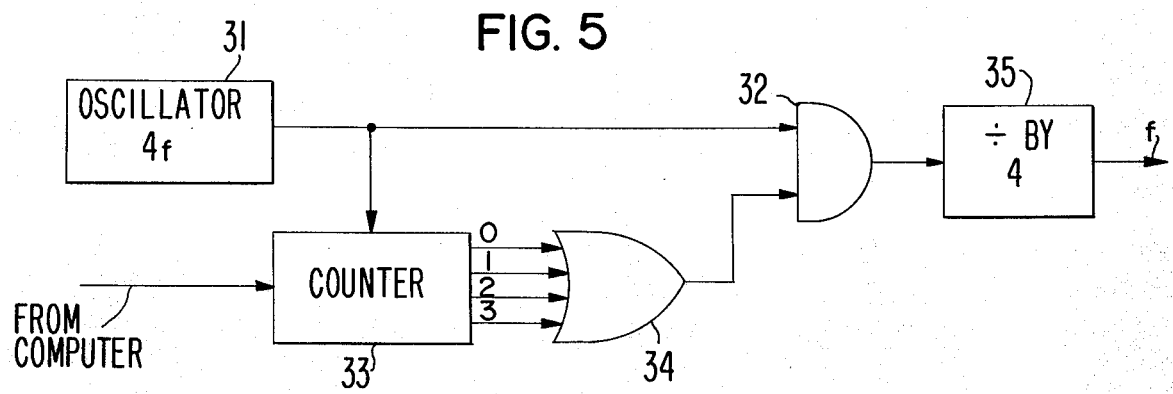
FIG. 5

FOURIER TRANSFORM NMR SPECTROSCOPY EMPLOYING A PHASE MODULATED RF CARRIER

BACKGROUND OF THE INVENTION

The present invention relates in general to Fourier transform NMR spectroscopy and more particularly to such spectroscopy employing a pulse modulated rf carrier to obtain the Fourier sidebands for exciting resonance of the sample.

DESCRIPTION OF THE PRIOR ART

Heretofore, Fourier transform NMR spectrometers have been proposed wherein an rf carrier is pulse modulated at low frequencies to produce a train of very short radio frequency pulses having Fourier sideband components of a sufficient bandwidth to cover the spectral lines of a sample to be analyzed for exciting the sample into nuclear magnetic resonance. For example, pulses of 100μ sec duration at a rate of 1 pulse per second was common. Resonance was picked up by suitable detector coils and was phase sensitive detected to produce a composite audio frequency resonance signal. This audio signal was fed to a computer for successive sampling of the detected resonance signal existing in the time frame between successive transmitter pulses and was used to derive a set of time displaced analog signal components which were converted to digital form and stored in respective channels of the memory of the computer for time averaging same. The time averaged resonance signal derived from the respective channels were read out of the time averager and Fourier transformed via a suitable Fourier transformer program into the frequency domain to obtain a time averaged spectrum of the sample under analysis. Such a spectrometer is disclosed in U.S. Pat. No. 3,475,680 issued Oct. 28, 1969 and assigned to the same assignee as the present invention.

One of the problems encountered in this prior art type of NMR spectrometer is that anomalous phase and intensity effects are encountered in the resultant spectral data. These anomalies occur when the interval between rf pulses is made short in comparison with the spin-spin relaxation times of the nuclei under analysis and they are associated with the establishment of a steady-state response where there are finite macroscopic transverse components of magnetization at the end of the pulse interval. The regular pulse sequence has the property of refocusing the isochromatic magnetization vectors that have been dispersed by field inhomogenity, giving rise to a spin echo at the time of the next pulse. In some cases, these echos, phase and intensity effects may be averaged out by short-term instabilities in the field/frequency ratio or by incoherence introduced by heteronuclear noise decoupling.

Pseudorandom excitation schemes are also known for providing wideband excitation of the sample as in U.S. Pat. No. 3,581,191 issued May 25, 1971 which utilize binary phase or intensity modulation. Such anomalies are described in an article titled "Phase and Intensity Anomalies in Fourier Transform NMR" by Ray Freeman and H. D. W. Hill appearing in the *Journal of Magnetic Resonance*, Vol. 4, pages 366–383, published in 1971.

In this article, as well as in copending U.S. patent application Ser. No. 367,598 filed June 4, 1973 and assigned to the same assignee as the present invention, a scheme is disclosed which effectively eliminates these anomalies by introducing a small random delay in the timing of the radio frequency pulses. Introducing this random delay in the timing of the radio frequency pulses is suitable for most spectrometer applications but there are cases where the timing between radio frequency pulses is relatively short and, thus, any delays introduced in the timing tend to greatly increase the spectrometer time required to obtain the desired time average spectral data.

It has also been proposed to eliminate the anomalous phase and intensity effects in Fourier transform NMR spectroscopy by periodically shifting the frequency of the carrier signal from one frequency to another of at least four different frequencies in accordance with a predetermined sequence. This change of the excitation frequency would serve to shift all the Fourier sideband lines of the radiation spectrum by the same amount. Thus, by using the frequency shift Fourier transform technique, an accurate adjustment of the pulse length is not necessary, nor is an adjustment of the phase of the apparatus necessary. The only thing to be changed is the computer program.

Also, the frequency shift spectrometer delivers four times the quantity of data as the conventional Fourier transform spectrometer as disclosed in the aforecited patent U.S. 3,475,680. Thus, the memory of the computer to evaluate the frequency shift Fourier transform measurement should be greater than that used for a normal Fourier transform spectrometer. For high resolution spectroscopy, the frequency shifting is extremely critical and dependent on the utilized pulse spacing. This frequency shift Fourier transform method is described by A Schwenk in the *Journal of Magnetic Resonance*, Vol. 5, pages 376–389, published in 1971.

SUMMARY OF THE PRESENT INVENTION

The principal object of the present invention is the provision of an improved method and apparatus for pulse NMR spectroscopy for eliminating phase and intensity anomalies in the frequency spectrum utilizing a means for switching the phase of the rf excitation pulses in a predetermined manner.

In one feature of the present invention, the phase of the pulsed radio frequency carrier is periodically shifted from one phase to another of at least three different relative phases for eliminating undesired phase and intensity anomalies in the Fourier transformed spectrum of the sample under analysis.

In another feature of the present invention, the rf carrier is switched between four phases by means of switching in different delays of the pulsed carrier signal.

In another feature of the invention the phase of pulsed carrier signal is sequentially switched by deriving the carrier frequency by means of a divider which divides a higher frequency signal and variably delaying the high frequency signal to the divider to derive the variable phase shifts of the carrier signal.

Other features and advantages of the present invention will become apparent upon a perusal of the following specification taken in connection with the accompanying drawings wherein:

BRIEF DESCRIPTION OF THE DRAWINGS

FIG. 1 is a schematic block diagram of an NMR spectrometer employing features of the present invention, FIG. 2 is a schematic line diagram of a phase shifter employed in the circuit of FIG. 1, FIG. 3 is a waveform diagram depicting four different phase sequences for the phase of the pulsed carrier utilized in the spectrometer of the present invention, FIG. 5 is a schematic block diagram of an alternative phase shifter of the present invention.

DESCRIPTION OF THE PREFERRED EMBODIMENT

Figure 4:
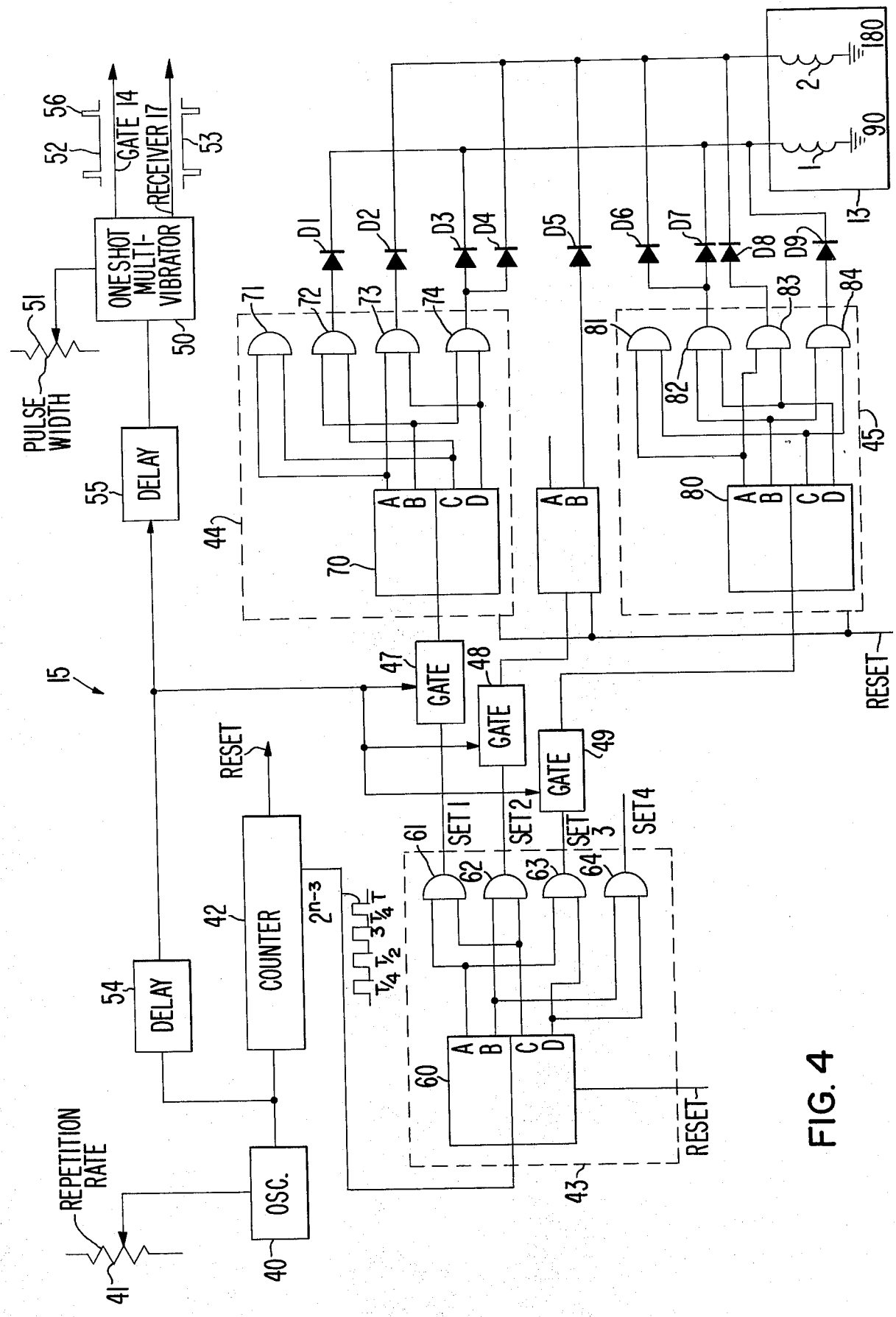
FIG. 4 is a schematic diagram of the control of the phase shifter of the present invention.

Referring not to FIG. 1 there is shown a Fourier transform NMR spectrometer employing features of the present invention. More particularly, a radio frequency transmitter 11 supplies a carrier signal at a suitable frequency displaced in frequency to one side of the nuclear magnetic resonance frequency of a sample under analysis which is disposed within a probe 12 and immersed in a dc polarized magnetic field of high homogeneity. The output of the rf transmitter 11 is fed to the input of a phase shifter 13 which serves to shift the phase of the rf carrier in 90° increments according to the relative phase relationships indicated in FIG. 3. More particularly, the phase of the rf carrier is shifted according to the sequences one through four of FIG. 3 where phase A corresponds to an rf pulse with zero phase shift, phase B corresponds to an rf pulse with 90° phase shift relative to A, C is an rf pulse with 180° phase shift relative to A and D is an rf pulse with 270° phase shift relative to A.

The first pulse train of sequencing pulses through A, B, C, D, phase shift has a duration corresponding to one quarter of the total time that the sample will be under analysis, e.g., total time usually in order of several minutes. And, similarly, the second pulse train follows the first pulse train and similarly extends for one quarter of the total observation time, as do the third and fourth trains.

The phase shifted carrier is passed by gate 14 in accordance with a duty cycle derived from a control 15. The pulse width and pulse period are selected by the control to derive Fourier side band components of sufficient bandwidth to simultaneously excite the various resonance spectral lines of the sample under analysis. The output of the gate 14 is fed to a power amplifier 16 and thence to the probe 12 for exciting resonance of the sample.

Resonance of the sample is detected in a detector coil, of conventional design, and fed to the input of a receiver 17 for amplification therein. The amplified output is thence fed to one input of a phase sensitive detector 18 for phase detection against a sample of the phase shifted carrier to derive an audio frequency composite resonance signal which is thence fed to the input of the signal averager 19 which output is transformed to the frequency spectrum in Fourier transformer 10 and displayed.

The control 15 preferably generates time share modulation commands so that the receiver 17 is deactivated as by an internal gate during the time that the transmitter pulse is applied to the probe 12 so that radio frequency energy is not directly coupled from the transmitter 11 through the probe 12 into the receiver 17 which would otherwise tend to overload the receiver. A time share modulation scheme forms the subject matter of U.S. Pat. No. 3,786,341 issued Jan. 15, 1974 and assigned to the same assignee as the present invention.

Thus, the receiver 17 is gated on during the times in between successive rf pulses applied to the probe 12.

Each of the detected analog audio frequency composite, or a separate time averaging computer, resonance signals is fed to the input of the signal averager 19 wherein it is time scanned and sampled at a multiplicity of time displaced intervals. The sampled quantities are converted from analog-to-digital quantities and stored in respective channels of the memory of the computer. Each of the time scans of successive analog composite resonance signals is synchronized with the time of the ends of the rf pulses to preserve relative phase information of the composite resonance signals for separating the absorption mode resonance signal components from the dispersive components. This phase synchronization and time averaging scheme forms the subject matter of U.S. Pat. No. 3,581,191 issued May 25, 1971 and assigned to the same assignee as the present invention.

Successive composite resonance signals derived from the sample are time averaged by adding the sampled data from corresponding time points from successive scans. Upon the completion of the desired number of pulse resonances or scans, the time averaged data is read out of the respective channels and Fourier transformed in any manner from the time domain into the frequency domain by transformer 10. This could also be accomplished in a digital computer using conventional Fourier transform algorithms as taught in the aforecited patents, such as U.S. Pat. No. 3,475,680, to derive a time averaged spectrum of the sample under analysis which is then printed out of the computer by a conventional print out.

The deleterious anomalies can be eliminated by dividing the experiment into time frames in which different sequences of phases of the rf pulse excitation are applied, as long as three or more phases are available. In general, if there are $Ni$ different phases, $i>2$ where sequence $N_1, N_2 \ldots Ni$ is designated as sequence 1, one may determine the phase sequences for each set by dividing the experiment time into $i$ equal time sets, then

| Set 1 | — | use sequence 1 |
| 2 | — | use every second phase from sequence 1 |
| 3 | — | use every third phase from sequence 1 |
| ⋮ | | ⋮ |
| $i$ | | use every $i$ phase from sequence 1 |

Furthermore, the sets may be used in any order. It is also believed that a single set having at least three or more phases in a random or pseudorandom sequence would also be effective.

An advantage of the spectrometer of FIG. 1 is that, the duration between successive pulses is constant as contrasted with the random pulse delay technique and accordingly avoids introducing problems where the delay may be significant with respect to the relaxation time of samples. As contrasted with the frequency shift method, the scheme of the present invention has the advantage that only one Fourier transform must be executed and no critical frequency adjustments are required. Also, the pulse spacing can be changed without any further change required. In addition the size of the memory of the computer can be reduced as contrasted with the memory requirements for the frequency shift method.

Referring now to FIG. 2 there is shown one embodiment of the phase shifter 13. In this embodiment, a pair of relay operated switches are provided in series with the transmission line between the rf transmitter 11 and the gate 14. The first relay operated switch has two positions. In a first position a zero degree phase shift or delay line 21 is switched into series with the transmission line 22 and the second relay operated switch similarly switches in another zero phase shift or zero delay line 24 in series with line 22. Thus, in this position zero phase shift is encountered between the transmitter 11 and the gate 14. The relay operated switches are preferably the type which always return to the first position unless energized. These relays could be semiconductor switches or polarity sensitive relays which operate in two directions based on the polarity of the driving pulses.

In a second position corresponding to phase shift B, the first relay operated switch is energized to switch into series with line 22 a 90° phase shift or delay line 25 while leaving delay line 24 in series with the line 22 so that a total of 90° phase shift is obtained. In a third position corresponding to phase shift C, the first relay switch is energized to switch into line 22 the zero degree phase shift or delay line 21 and the second relay operated switch is energized to switch into series with line 22 a 180° phase shift or delay line 26 so that the total delay from the transmitter 11 to the gate 14 is 180°. The fourth state of the phase shifter corresponds to phase shift D and the first relay operated switch is energized to connect the 90° phase shift line 25 in series with line 22 and the second relay switch is energized with current from the control to switch into series with line 22 the 180° delay line 26 such that the total delay from the transmitter 11 to the gate 14 is 270°.

Referring now to FIG. 4, there is shown one embodiment of the control 15. Oscillator 40, as of 1Hz, is fed to total pulse counter 42 which is provided with sufficient stages to count each pulse over the entire experiment time T without any spill over. When the designated last stage of counter 42 changes state it generates the reset command to the set generator 43 and sequence generators 44, 45, and 46. Assuming that the counter contains n stages, the output of the n−3 stage provides a wave train which has a negative going pulse at each increment of ¼T, thereby providing a pulse train which enables division of the total experiment time into four equal sets. The output from the n−3 counter of counter 42 is connected to the set counter 43 which causes the set counter to provide an output to enable one of the gates 47, 48 or 49 depending upon the quarter of the experiment time. Outputs A, B, C, D of flip-flop 60 of set counter 43 are connected to AND gates 61 through 64 such that AND gate 61 (SET 1) provides an output when A.C is a logical 1, AND gate 62 (SET 2) provides an output when B.C is a logical 1, AND gate 63 (SET 3) provides an output when A.D is a logical 1, and AND gate 64 (SET 4) provides an output when B.D is a logical 1. The output of AND gate 64 is not connected to enable any gates since each pulse in SET 4 has a zero phase shift which is accomplished without energizing either relay 1 or relay 2. The output of oscillator 40 is connected to delay 54 and thence to gates 47, 48 and 49 for passage through the appropriate gate to their corresponding sequence generator. For example, during SET 1, the output of gate 47 pulses two stage flip-flop 70 of sequence one generator 44. The A, B, C, D outputs are connected to AND gates 71–74 such that AND gate 71 provides an output when A.C is a logical 1, AND gate 72 provides an output when B.C is a logical one, AND gate 73 provides an output when A.D is a logical one, and AND gate 74 provides an output when B.D is a logical one. It can be seen therefore that sequence one generator 44 provides an output from AND gates 71, 72, 73, and 74 in sequence upon the initiation of each pulse from gate 47. AND gate 71 is not connected to either relay coil 1 or relay coil 2, therefore when AND gate 71 is a logical 1 the pulse from phase shifter 13 to gate 14 will be at zero phase. AND gate 72 is connected through isolation diode D1 to relay coil 1 in phase shifter 13, so that when AND gate 72 is a logical one, the pulse from phase shifter 13 to gate 14 will be at 90° phase. Similarly, AND gate 73 is connected through diode D2 to relay coil 2 to generate the 180° pulse and AND gate 74 is connected through relay diodes D3 and D4 to both relay coils 1 and 2 in order to generate the 270° pulse.

Sequence two generator 45 is less complicated since sequence 2 uses only two phases. Accordingly, gate 48 is connected to sequence generator 46 which comprises a single stage flip-flop having its B output connected through diode D5 to relay coil 2. Since the A output of generator 46 does not energize a relay coil, the phases switch back and forth between the zero phase and 180 phase on each pulse.

Sequence three generator 45 is identical to sequence one generator 44 except that the AND gates 82 and 84 are reversed in regard to which relay coil they energize. Accordingly, the sequence three pulse phase sequence is as shown in FIG. 3.

The output of delay 54 is connected to delay 55 before connecting to one shot multivibrator 50. Delay 55 is to give relay coils 1 and 2 an opportunity to switch and stop bouncing before the multivibrator 50 having the output waveform 52 energizes the gate 14 to enable the excitation pulse to excite the probe 12. The time share modulation pulse train 53 is also derived from the multivibrator 50 and fed to receiver 17 to cause the receiver to have low response during the time of the peaks 56 of the pulse train 52.

The repetition adjustment potentiometer 41 enables variation in the oscillator 40 frequency and pulse width potentiometer enables adjustment of the pulse width outputs of multivibrator 50. These adjustments enable the operator to adjust the density and shape of the Fourier components and envelope of the rf excitation energy.

Referring now to FIG. 5 there is shown an alternative rf transmitter phase shifter circuit 11 and 13. An rf oscillator, operating at four times the frequency of the carrier which is to be pulse modulated 31, feeds an output to one input of an AND gate 32. A second output of the oscillator 31 is fed to the input of a counter 33 which is under the control of an output derived from the control 15. The counter contains four different counting stages. In a first stage, the output of the oscillator 31 is fed directly without delay to the input of an OR gate 34. In the second stage of the counter the counter counts one complete period of the output frequency of oscillator 31 and then feeds an output to the OR gate 34. The third stage of the counter counts for two periods of the oscillator 31 and then feeds an output to the OR gate 34. The fourth stage of the counter counts for three periods and then feeds an output to the OR gate 34. Thus, the output of the counter 33, depending upon the particular stage that is energized by the output of the control 15, will provide delays of zero, one cycle, two cycles and three cycles of the oscillator frequency 4f.

The output of the OR gate 34 is fed in as a second input to the AND gate 32 for ANDING with the output of the oscillator 31. The output of the AND gate 32 is fed to a divider 35 for division by four to obtain the carrier frequency $f$. Thus, the carrier frequency $f$ is phase shifted by 0°, 90°, 180° and 270° depending upon the output of the counter 33 as determined by the output of the computer 15. These phase shifts correspond to A, B, C, and D, respectively, as utilized in the diagram of FIG. 3.

While the invention has been described in terms of its preferred practice and in terms of preferred embodiments, departures may be made from the procedure and embodiments thus described and still remain within the scope of the claims.

What is claimed is:

1. In a magnetic resonance spectrometer:
    means for generating a band of radio frequency energy for irradiation of a sample of matter to be analyzed, such band of energy having a sufficient bandwidth to cover the spectral lines of the sample to be analyzed for simultaneously exciting radio frequency magnetic resonance of different resonance spectral lines, if any, within the sample;
    means for detecting the excited resonance of the sample to obtain a composite resonance signal therefrom for analysis of the sample;
    means for repetitively time scanning, sampling and storing a multiplicity of successive time displaced components of the composite resonance signal in a multiplicity of respective channels;
    means for reading out the signal components stored in such channels; and
    said means for generating the band of radio frequency energy for irradiation of the sample including, means for generating a radio frequency carrier signal, and means for periodically shifting the phase of said carrier signal from one phase to another of at least three different relative phases in accordance with a predetermined sequence.

2. The apparatus of claim 1 wherein said phase shifting means for shifting the phase of the carrier energy includes, a plurality of delay means one for each of said phase relations relative to a reference phase relation, and means for sequentially switching respective ones of said delay means in circuit between said carrier signal generating means and the sample to be irradiated.

3. The apparatus of claim 1 wherein said phase shifting means for shifting the phase of the carrier energy includes, a source of radio frequency energy at a number n times the frequency of said carrier signal energy to be generated, means for dividing the radio frequency energy output of said source by the number n to derive said radio frequency carrier signal, and delay means interposed in circuit between said source of radio frequency energy and said divider means for variably delaying the radio frequency energy to said divider means by a variable number of periods of the radio frequency energy to be divided to derive variable phase shifts of the generated carrier signal.

4. The apparatus of claim 1 including pulse modulator means for pulsing the intensity of the carrier signal energy to produce a train of radio frequency pulses for generating bands of Fourier components of radio frequency energy for irradiation of the sample.

5. The apparatus of claim 4 wherein said means for repetitively time scanning, sampling and storing a multiplicity of successive time displaced components of the composite resonance signal in a multiplicity of respective channels includes means for scanning the detected composite resonance signal during the period between successive pulses of the carrier signal energy, and storing and adding respective time displaced composite resonance signal components to those of previous scans to obtain time averaged data in separate respective channels of a memory, and means for Fourier transforming the read out time averaged signal components from the time domain into the frequency domain to obtain time average spectral data concerning the sample under analysis.

6. A nuclear magnetic resonance spectrometer for producing nuclear magnetic resonance spectrum from a sample under analysis comprising means for producing a unidirectional polarizing magnetic field enveloping said sample, means for applying a plurality of time-spaced pulses of driving radio frequency magnetic field to said sample for an experiment time T to produce a series of successive free precession signals from said sample responsive to said driving pulses, means for demodulating said free precession signals to obtain a series of free induction decay envelope signals, means for time-averaging discrete segments of said decay signals over the series of successive signals, wherein said means for applying a plurality of time-spaced pulses of driving radio frequency magnetic field includes means for providing said pulses in $N_i$ different phases relative to a reference phase where $i$ is an integer greater than 2, means for dividing said experiment time T into $i$ approximately equal time increments and means for arranging said time-spaced pulses in $i$ different sets.

7. The spectrometer of claim 6 wherein said means for applying a plurality of time-spaced pulses includes means for selecting the sequence of said time-spaced pulses such that said first set is applied during said first time period, said second set is applied in said second time period and so on until said $i$ set is applied in said $i$ time period.

8. The spectrometer of claim 6 wherein said means for arranging said time-spaced pulses in $i$ different sets includes means for generating the sets such that SET 1 equals $N_1, N_2, N_3 ... N_i, N_1, N_2, N_3 ... N_i ...$
SET 2 equals $N_1, N_3, N_5, N_7 ...$
SET 3 equals $N_1, N_4, N_7, N_{10} ...$
SET 4 equals $N_1, N_5, N_9, N_{13} ...$
$\vdots$
SET $i$ equals $N_1, N_1, N_1, N_1 ...$ 9. The spectrometer of claim 8 wherein $i$ equals 4, such that SET 1 equals $N_1, N_2, N_3, N_4, N_1, N_2, N_3, N_4 ...$
SET 2 equals $N_1, N_3, N_1, N_3, N_1, N_3, N_1, N_3 ...$
SET 3 equals $N_1, N_4, N_3, N_2, N_1, N_4, N_3, N_2 ...$
SET 4 equals $N_1, N_1, N_1, N_1, N_1, N_1, N_1, N_1 ...$ 10. In a method for obtaining magnetic resonance of a sample under analysis including the steps of:
    generating a band of radio frequency energy;
    irradiating a sample of matter to be analyzed with the band of radio frequency energy, such energy having a sufficient bandwidth to cover the spectral lines of the sample to be analyzed for simultaneously exciting radio frequency magnetic resonance of different resonance spectral lines, if any, within the sample;

detecting the excited resonance of the sample to obtain a composite resonance signal therefrom for analysis of the sample;

repetitively time scanning, sampling and storing a multiplicity of successive time displaced components of the composite resonance signal in a multiplicity of respective channels;

reading out the signal components stored in such channels; and wherein the step of generating the band of radio frequency energy for irradiation of the sample includes the step of, generating a radio frequency carrier signal, and shifting the phase of the carrier signal from one phase to another of at least three different relative phases in accordance with a predetermined sequence.

11. The method of claim 10 wherein the step of generating a band of radio frequency energy for irradiation of the sample to be analyzed includes the step of pulse modulating the intensity of the carrier signal to produce a train of radio frequency pulses such train of pulses having Fourier side band components of radio frequency energy which are utilized for irradiation of the sample.

12. The method of claim 11 wherein the step of repetitively time scanning, sampling and storing a multiplicity of successive time displaced components includes, the step of time scanning the detected composite resonance signal during the period between successive pulses of the carrier signal energy, and storing and adding respective sampled time displaced composite resonance signal components to those of previous scans to obtain time averaged data in separate respective channels of a memory, and Fourier transforming the read out time averaged signal components from the time domain into the frequency domain to obtain time averaged spectral data concerning the sample under analysis.

13. The method of obtaining magnetic resonance spectrum of a sample under analysis including the steps of:

producing a unidirectional polarizing magnetic field enveloping said sample, applying a plurality of time-spaced impulses of driving radio frequency magnetic field to said sample for an experiment time T to produce a series of successive free precession signals from said sample responsive to said driving pulses, demodulating said free precession signals to obtain a series of free induction decay envelope signals, time-averaging discrete segments of said decay signals over the series of successive signals, wherein said step of applying said plurality of time-spaced pulses includes providing said pulses in $N_i$ different phases relative to a reference where $i$ is an integer greater than 2, dividing said experiment time T into $i$ equal time increments and arranging said time-spaced pulses in $i$ different sets.

14. The method of claim 13 wherein the step of applying a plurality of time-spaced includes selecting the sequence of said time-spaced pulses such that said first set is applied during said first time period, said second set is applied during said second time period, and so on until said $i^{th}$ set is applied in said $i^{th}$ time period.

15. The method of claim 14 wherein the step of arranging said time-spaced pulses in $i$ different set includes generating the sets such that SET 1 equals $N_1, N_2, N_3, ... N_i, N_1, N_2, N_3 ...$
SET 2 equals $N_1, N_3, N_5, N_7 ...$
SET 3 equals $N_1, N_4, N_7, N_{10} ...$
SET 4 equals $N_1, N_5, N_9, N_{13} ...$
.
.
SET i equals $N_i, N_i, N_i, N_i ...$ .

16. The method of claim 14 wherein $i = 4$.

* * * * *

UNITED STATES PATENT AND TRADEMARK OFFICE
CERTIFICATE OF CORRECTION

PATENT NO. : 3,968,424
DATED : 07/06/76
INVENTOR(S) : Richard R. Ernst

It is certified that error appears in the above-identified patent and that said Letters Patent are hereby corrected as shown below:

Column 3, line 13, "not" should be -- now -- ;

Column 10, line 8, "impulses" should be -- pulses -- ;

Column 10, line 24, "pulses" should be inserted before -- includes -- ; and

Column 10, line 31 "set" should be -- sets -- .

Signed and Sealed this

Nineteenth Day of October 1976

[SEAL]

Attest:

RUTH C. MASON
Attesting Officer

C. MARSHALL DANN
Commissioner of Patents and Trademarks